(12) United States Patent
Smink et al.

(10) Patent No.: US 9,124,037 B2
(45) Date of Patent: Sep. 1, 2015

(54) HIGH SPEED INPUT/OUTPUT CONNECTION INTERFACE ELEMENT, CABLE ASSEMBLY AND INTERCONNECTION SYSTEM WITH REDUCED CROSS-TALK

(71) Applicants: Tyco Electronics Belgium EC BVBA, Oostkamp (BE); Tyco Electronics Nederland BV, S-Hertogenbosch (NL)

(72) Inventors: Rutger Smink, Hamont-Achel (BE); Lieven Decrock, Roeselare (BE)

(73) Assignees: TE Connectivity Nederland BV, S-Hertogenbosch (NL); Tyco Electronics Belgium EC BVBA, Oostkamp (BE)

(*) Notice: Subject to any disclaimer, the term of this patent is extended or adjusted under 35 U.S.C. 154(b) by 0 days.

(21) Appl. No.: 14/063,646

(22) Filed: Oct. 25, 2013

(65) Prior Publication Data
US 2014/0051288 A1 Feb. 20, 2014

Related U.S. Application Data

(63) Continuation of application No. PCT/EP2012/057400, filed on Apr. 23, 2012.

(51) Int. Cl.
*H01R 13/6461* (2011.01)
*H01R 13/6466* (2011.01)
*H01R 9/03* (2006.01)
(Continued)

(52) U.S. Cl.
CPC ........ *H01R 13/6461* (2013.01); *H01R 13/6466* (2013.01); *H05K 1/0253* (2013.01); *H01R 9/032* (2013.01); *H01R 12/62* (2013.01); *H01R 13/6585* (2013.01); *H01R 24/64* (2013.01); *H01R 2107/00* (2013.01); *H05K 1/0219* (2013.01); *H05K 1/0221* (2013.01); *H05K 1/0225* (2013.01); *H05K 1/0245* (2013.01); *H05K 1/117* (2013.01); *H05K 3/3405* (2013.01);
(Continued)

(58) Field of Classification Search
CPC ............ H01R 13/6658; H01R 23/025; H01R 23/688; H01R 23/6873
USPC ................................. 439/76.1, 108
See application file for complete search history.

(56) References Cited

U.S. PATENT DOCUMENTS 6,867,668 B1 * 3/2005 Dagostino et al. ............ 333/246
7,145,411 B1 * 12/2006 Blair et al. ........................ 333/5
(Continued)

FOREIGN PATENT DOCUMENTS

GB 1290800 9/1972

OTHER PUBLICATIONS

PCT Notification Concerning Transmittal of International Preliminary Report on Patentability issued in co-pending International Application No. PCT/EP2012/057400, dated Nov. 7, 2013, 1 page.
PCT Written Opinion of the International Searching Authority issued in co-pending International Application No. PCT/EP2012/057400, dated Oct. 29, 2013, 6 pages.
PCT Search Report & Written Opinion issued in co-pending International Application No. PCT/EP2012/057400, dated Jul. 5, 2012, 10 pages.

*Primary Examiner* — Gary Paumen
(74) *Attorney, Agent, or Firm* — Barley Snyder

(57) ABSTRACT

A high speed input/output plug assembly is disclosed having a plug body. A plurality of conductive traces are disposed on a surface of the plug body and connectable to an input/output cable. An electrically conductive grounding layer is positioned within the plug body and electrically insulated from the conductive traces, and has an opening extending through the grounding layer and below the conductive traces.

23 Claims, 6 Drawing Sheets

(51) Int. Cl.
  *H01R 12/62*    (2011.01)
  *H01R 13/6585*  (2011.01)
  *H01R 24/64*    (2011.01)
  *H01R 107/00*   (2006.01)
  *H05K 1/02*     (2006.01)
  *H05K 1/11*     (2006.01)
  *H05K 3/34*     (2006.01)

(52) U.S. Cl.
  CPC .............. *H05K 2201/0969* (2013.01); *H05K 2201/09236* (2013.01); *H05K 2201/10287* (2013.01)

(56) References Cited

U.S. PATENT DOCUMENTS

| | | |
|---|---|---|
| 2004/0038564 A1* | 2/2004 | Yan .............................. 439/76.1 |
| 2009/0277665 A1 | 11/2009 | Kumamoto et al. |
| 2010/0210142 A1* | 8/2010 | McGrath et al. ......... 439/620.22 |
| 2011/0195592 A1 | 8/2011 | McGrath et al. |
| 2011/0195593 A1 | 8/2011 | McGrath et al. |
| 2014/0051288 A1* | 2/2014 | Smink et al. ............. 439/607.01 |
| 2014/0349496 A1* | 11/2014 | Zhu et al. ...................... 439/108 |

* cited by examiner

HIGH SPEED INPUT/OUTPUT CONNECTION INTERFACE ELEMENT, CABLE ASSEMBLY AND INTERCONNECTION SYSTEM WITH REDUCED CROSS-TALK

CROSS-REFERENCE TO RELATED APPLICATIONS

This application is a continuation application of PCT International Application No. PCT/EP2012/057400, filed Apr. 23, 2012, which claims priority under 35. U.S.C. §119 to European Patent Application No. EP2519086, filed Apr. 26, 2011.

FIELD OF THE INVENTION

The present invention generally relates to a plug assembly having a high speed input/output (I/O) connection interface element, and more specifically to an electrical interconnection system having a plug assembly and a jack connector.

BACKGROUND

Current communication systems commonly involve high data transfer rates of more than 5 Gbps. In such systems, cross-talk between signal lines is a major concern.

In an ideal electrical interconnection system, the system will carry signals without suffering from signal distortions such as cross-talk. Cross-talk occurs when one signal creates an unwanted signal on another signal line. Generally, cross-talk is caused by electromagnetic coupling between signal lines. Cross-talk is a particular problem for high-speed, high-density electrical interconnection systems. Electromagnetic coupling increases when adjacent signal lines are in close proximity or when signals being carried are higher in frequency. Both of these conditions are present in high-speed, high-density electrical interconnection systems. Discontinuities in the connectors often contribute to, and exacerbate, the cross-talk problems.

To reduce crosstalk signal distortion, a number of approaches are commonly used. For example, a shielding can be incorporated into the connectors in the connection system, or differential signals can be used in adjacent signal lines for transmitting information. One differential signal is carried on two conductors, with the signal being represented as the difference in electrical levels between the conductors. A differential signal is more resistant to cross-talk than a single-ended signal, because any stray signals impinging on the conductors will generally change the level on both conductors, but do not alter the difference in levels.

Consequently, conventional high-speed I/O connection cable assemblies use circuit boards as a plug body to be plugged into a jack connector and cables having a pair of wires for carrying the differential signal. The printed circuit board has traces and pads on at least one of its surfaces, wherein particular contact pads may be contacted by a mating receptacle. The traces transmit electrical signals across the printed circuit board. For example, they may transmit signals from the contacts of the mating receptacle to the wires of the plug assembly and vice versa.

The plug assembly may include several pairs of wires, such as four input signal cables and four output signal cables. However, the plug assembly may also include up to 32 or more pairs of wire, where the plug assembly includes wire pairs in increments of two. Often the plug assembly further includes drain wires which are connected to the shielding of each cable.

The transmission between the printed circuit board and the cable occurs through a connector, which connects the printed circuit board and the cable together. The connector therefore should also to be capable of handling the high data rates, in addition to preventing cross-talk signal distortion. With modern intercommunication systems becoming smaller in size, the size of connector is also being reduced. As the connector becomes smaller, the space between adjacent cables is also being reduced, which increases the chances of undesired cross-talk between the adjacent cables. Consequently, a major source of cross-talk is at the connector located at the printed circuit board and cable interface.

In order to reduce cross-talk on the connection interface element, it is known to separate the input and output pairs of wires (Rx and Tx) by routing the input and output pairs on the top and bottom of the printed circuit board, respectively. By employing additional ground layers within the printed circuit board, cross-talk between Rx and Tx lines can be eliminated effectively.

However, at the interface whereto the cable is soldered, impedance compensation is used in order to avoid distortions of the signal due to signal reflection. Therefore, conventional cable assemblies dispense with internal ground layers in the particular region where the cables are soldered to the conductive pads of the traces. However, by reducing impedance through this method, cross-talk signal distortion between the signal lines is no longer eliminated effectively. In particular, when complying with 10 Gbps specifications, such as IEEE standard 802.3ap 10GBASE-KR (2008), balancing impedance reduction with cross-talk reduction by these methods can result in unsatisfactory levels of both. Consequently, there is a great need to develop smaller connectors that effectively reduce both impedance and cross-talk at the same time.

SUMMARY

The object underlying the present invention therefore is to improve a high-speed input/output connection interface element and an associated plug assembly with regard to cross-talk reduction, at the same time maintaining the small form factor and a cost-effective construction.

A high speed input/output plug assembly is disclosed having a plug body. A plurality of conductive traces are disposed on a surface of the plug body and connectable to an input/output cable. An electrically conductive grounding layer is positioned within the plug body and electrically insulated from the conductive traces, and has an opening extending through the grounding layer and below the conductive traces.

An electrical interconnection system is also disclosed having a plurality of input/output cables, a plug assembly, and a jack connector. The plug assembly includes a plug body, a plurality of conductive traces disposed on opposite faces of the plug body and connectable to the plurality of input/output cables, and a pair of electrically conductive grounding layers positioned within the plug body. The grounding layers are electrically insulated from the conductive traces, and each grounding layer has a plurality of openings extending through the grounding layer. The jack connector has a plug assembly receiving space engageable with the plug assembly.

BRIEF DESCRIPTION OF THE DRAWINGS

The invention will now be described by way of example with reference to the accompanying figures of which.

DETAILED DESCRIPTION

Figure 1:
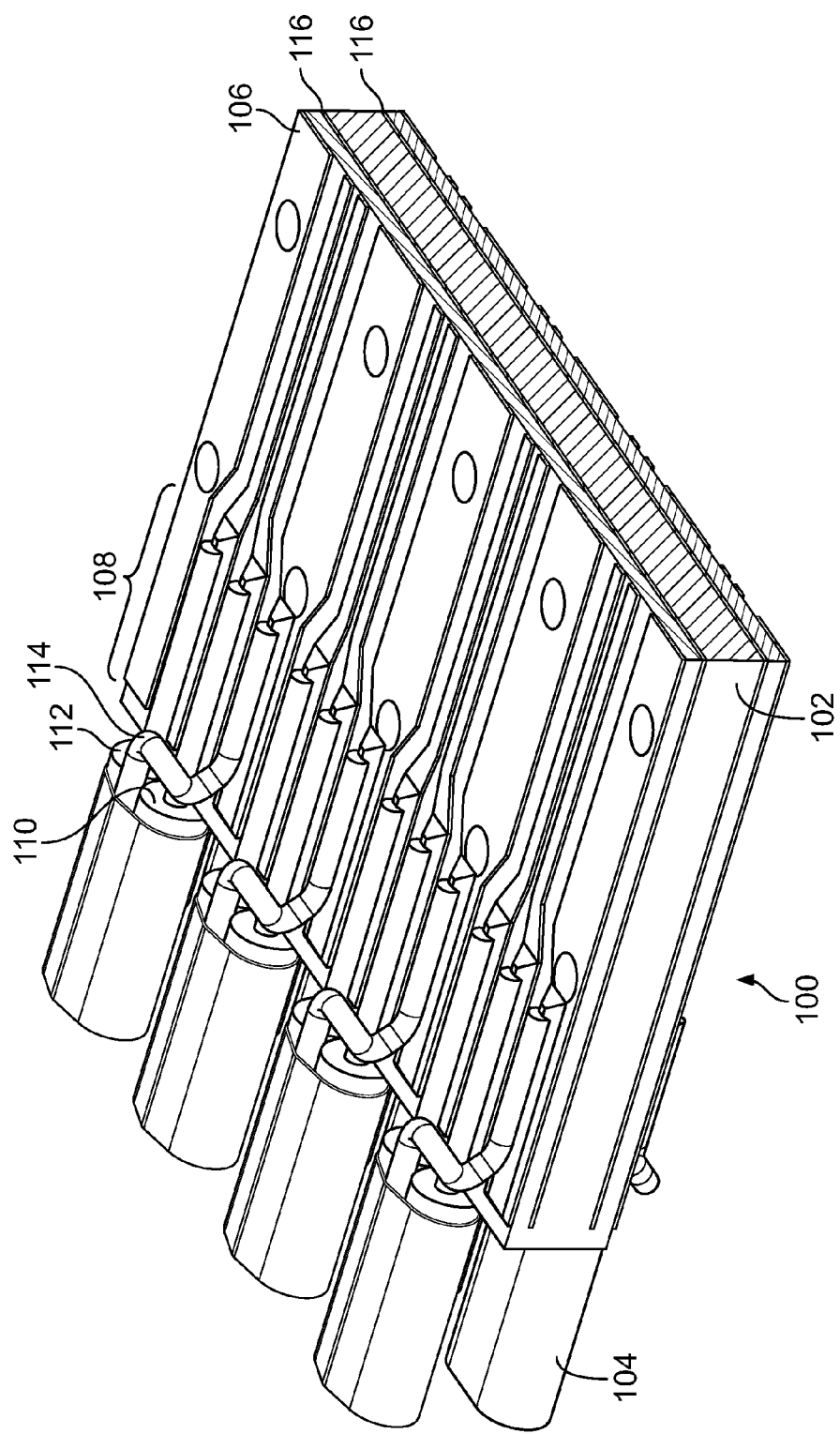
FIG. 1 shows a perspective view of a part of a plug assembly.

Exemplary embodiments of the invention will now be described as follows. FIG. 1 illustrates an exemplary embodiment of a plug assembly 100 includes a plug body 102 and a plurality of cables 104 which are soldered to the conductive pads on the traces on the plug body 102. The plug body 102 has a plurality of conductive traces 106 leading from a transition interface 108 to a plurality of contact regions for engaging with a jack connector. The conductive traces 106 may be disposed on a first surface of the plug body 102, or disposed on a second surface opposite the first surface, or disposed on both the first surface and second surface of the plug body 102. The contact regions will be explained in detail below with reference to FIGS. 2 to 4.

In an exemplary embodiment, the plug body 102 is a printed circuit board ("PCB"). The PCB may have a trace layer 106, a core layer, a grounding layer 116, a center layer, a second grounding layer 116, a second core layer and a second trace layer 106. The trace layers 106 and the grounding layers 116 are fabricated from a conductive material, such as copper, aluminum, or silver. The core layers and center layer are for instance fabricated from an insulated material, such as a composite of a resin epoxy re-enforced with a woven fiberglass mat, such as FR408. Furthermore, the PCB may also include a solder layer, which is located around the trace layers 106 and leaves open only the pad to be soldered and connection regions to be engaged with a jack connector.

In another exemplary embodiment, each cable 104 comprises a first wire 110 and a second wire 112, of which each wire 110, 112 carries a differential signal. The first and second wires 110, 112 are soldered, for example, to the traces 106 in the I/O transition interface 108 region. A ground wire 114 is positioned within a shielding of the cable 104, and is connected to a grounded trace. The grounded trace extends along the first surface body, or the second surface of the body, or along the first and second surfaces of the body. All of the ground wires 114 are connected to the grounded trace to form a common ground. The grounded trace is connected to a planar grounding layer 116 positioned within the plug body 102. See FIG. 2. In other exemplary embodiments, the first and second wires 110, 112 may be attached to the traces 106 by a suitable conductor, as well by other connecting technologies, such as crimped connections or plug connections.

In an exemplary embodiment, the input (Rx) and the output (Tx) cables are positioned so that on a first surface of the plug body 102 only the Tx cables are connected to the first surface traces 106 and on the second surface of the plug body 102 only the Rx cables are connected to the second surface traces 106. For reducing cross-talk between the upper and lower pairs of cables and traces 106, two grounding layers 116 are provided within the plug body 102. In another exemplary embodiment, only one grounding layer 116 is used. In yet another exemplary embodiment, two or more grounding layers 116 can be used.

Figure 2:
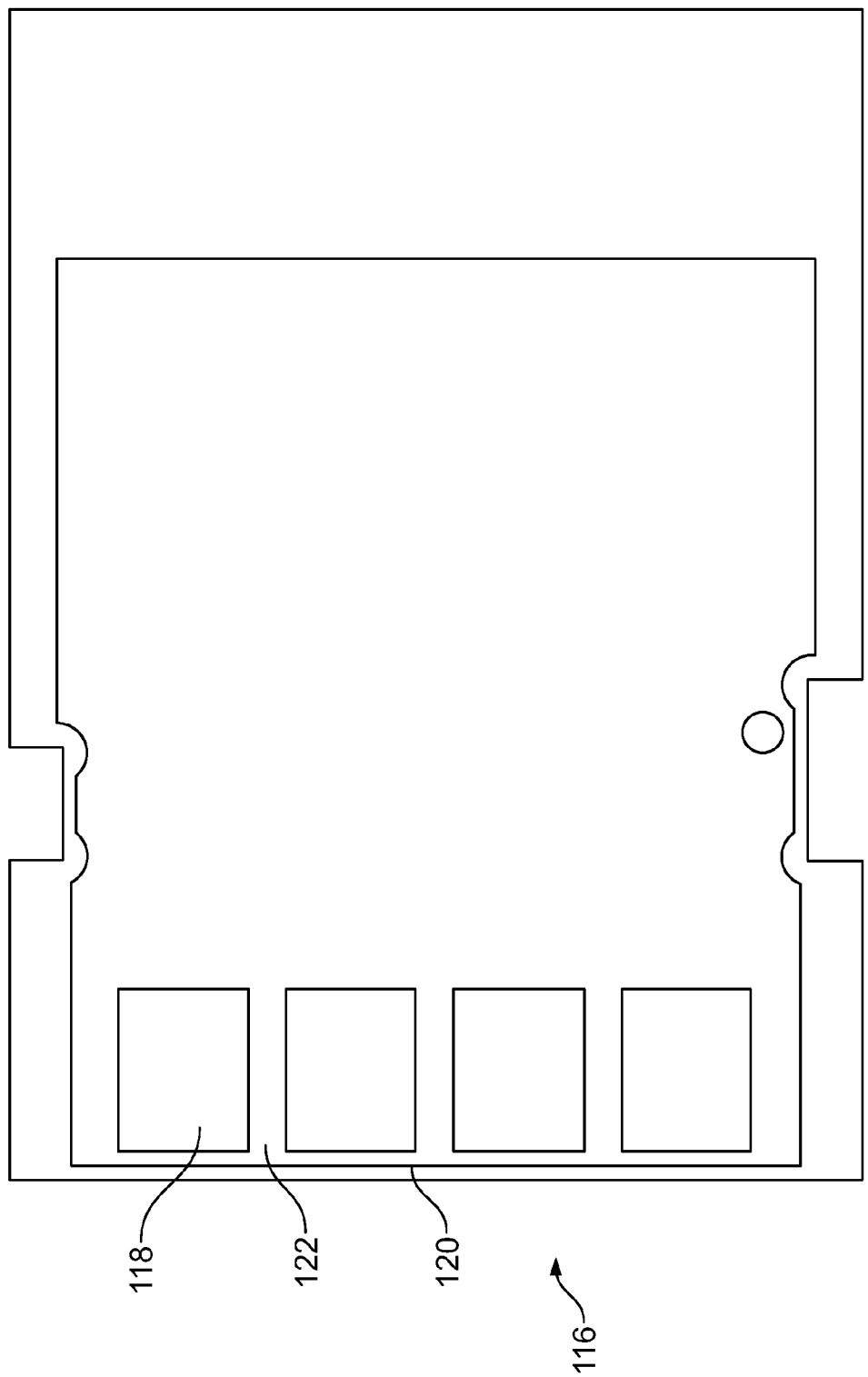
FIG. 2 shows the layout of a first ground plane layer.

As shown in FIG. 2, the planar grounding layer 116 is a continuous layer of metal that serves to shield the area where the traces 106 extend over the plug body 102. A plurality of openings 118 extending through the grounding layer 116 in the transition interface region 108, where the cables are soldered to solder pads of the interface element. The openings 118 extending through the grounding layer 116 are arranged and dimensioned in a way that directly below each pair of signal trace solder pads, no grounding layer 116 metal is present, whereas in an outer peripheral region narrow cross-talk suppression strips 120 are formed. In one exemplary embodiment, the openings 118 extending through the grounding layer 116 are square. However, in other exemplary embodiments, the openings 118 extending through the grounding layer 116 may be other common shapes, such as circular, rectangular, pentagonal, hexagonal, heptagonal, or triangular.

Each of the openings 118 extending through the grounding layer 116 is separated from adjacent openings 118 extending through the grounding layer 116 by metal strips 122 of the grounding layer 116. These metal strips 122 are positioned directly under the ground leads of the trace layer 106. Combining the metal strips 122 with a cross-talk suppression strip 120 positioned inside the plug body 102, a two-fold effect can be achieved: Firstly, a part of the grounding layer 116 is still underneath the respective traces having an effect equal to an ESD shield. Secondly, an impedance match is achieved, and signal reflections are avoided, through the incorporation of the openings 118 extending through the grounding layer 116 below the traces 106 in a region where the cables are connected. Therefore, cross-talk up to at least 5 GHz can be blocked, while still maintaining the unaltered (or only marginally different) differential impedance.

Figure 3:
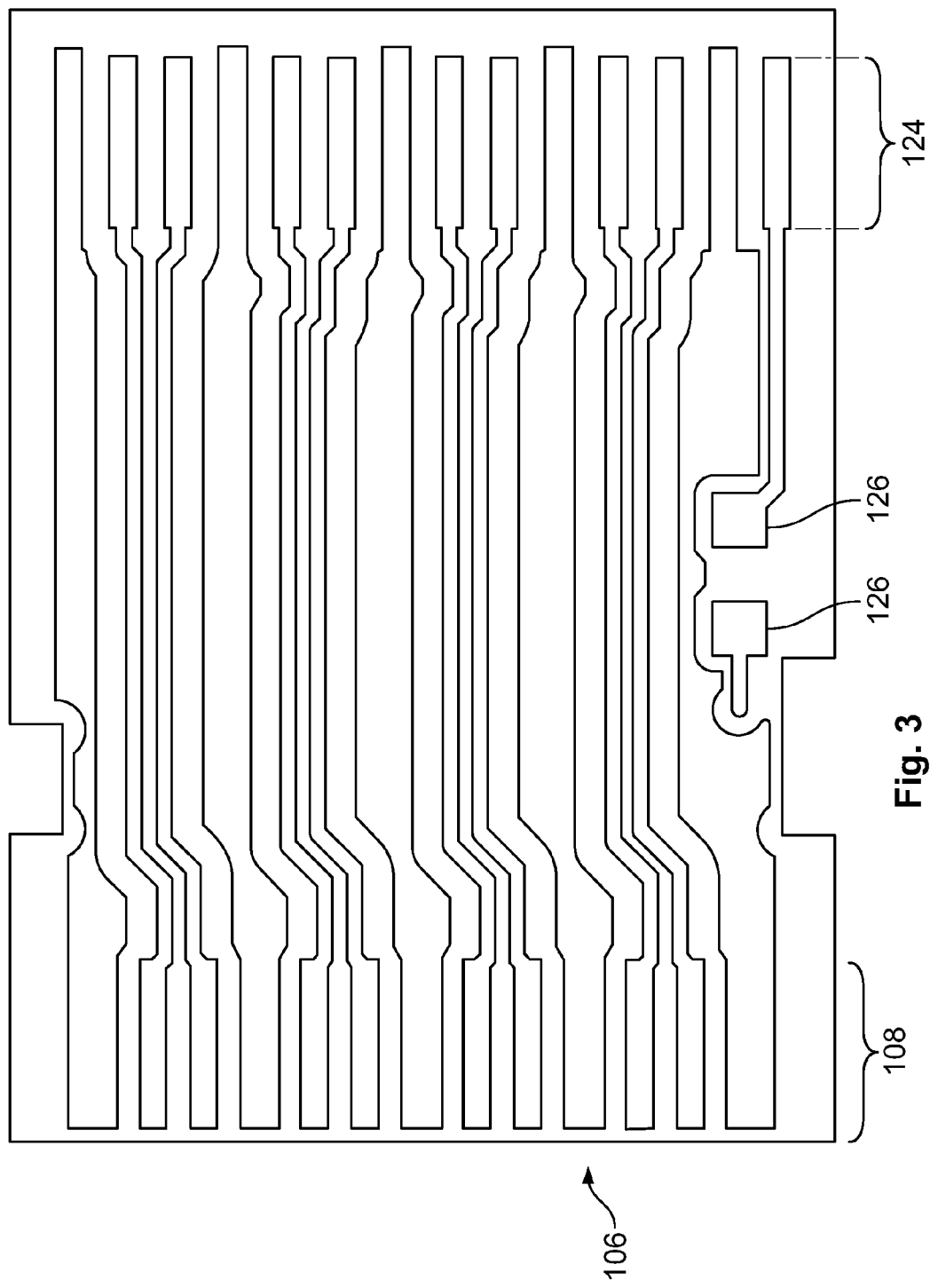
FIG. 3 shows the layout of a first trace layer.

FIG. 3 illustrates an exemplary embodiment of the first surface trace 106, which is present on the first surface of the plug assembly 100 of FIG. 1. As shown in FIG. 3, four pairs of traces 106 are leading from an I/O transition interface region 108 to a contact region which is adapted to be engaged with a belonging jack connector. Each pair of traces 106 is separated from the adjacent ones by means of grounding traces. In an exemplary embodiment, electronic components may be soldered to this layer, such as a light emitting diode (LED) to the LED contacts 126.

The second trace 106 on the second surface of the plug body 102 of FIG. 1 is designed in an analogous way as the one shown in FIG. 3.

Figure 4:
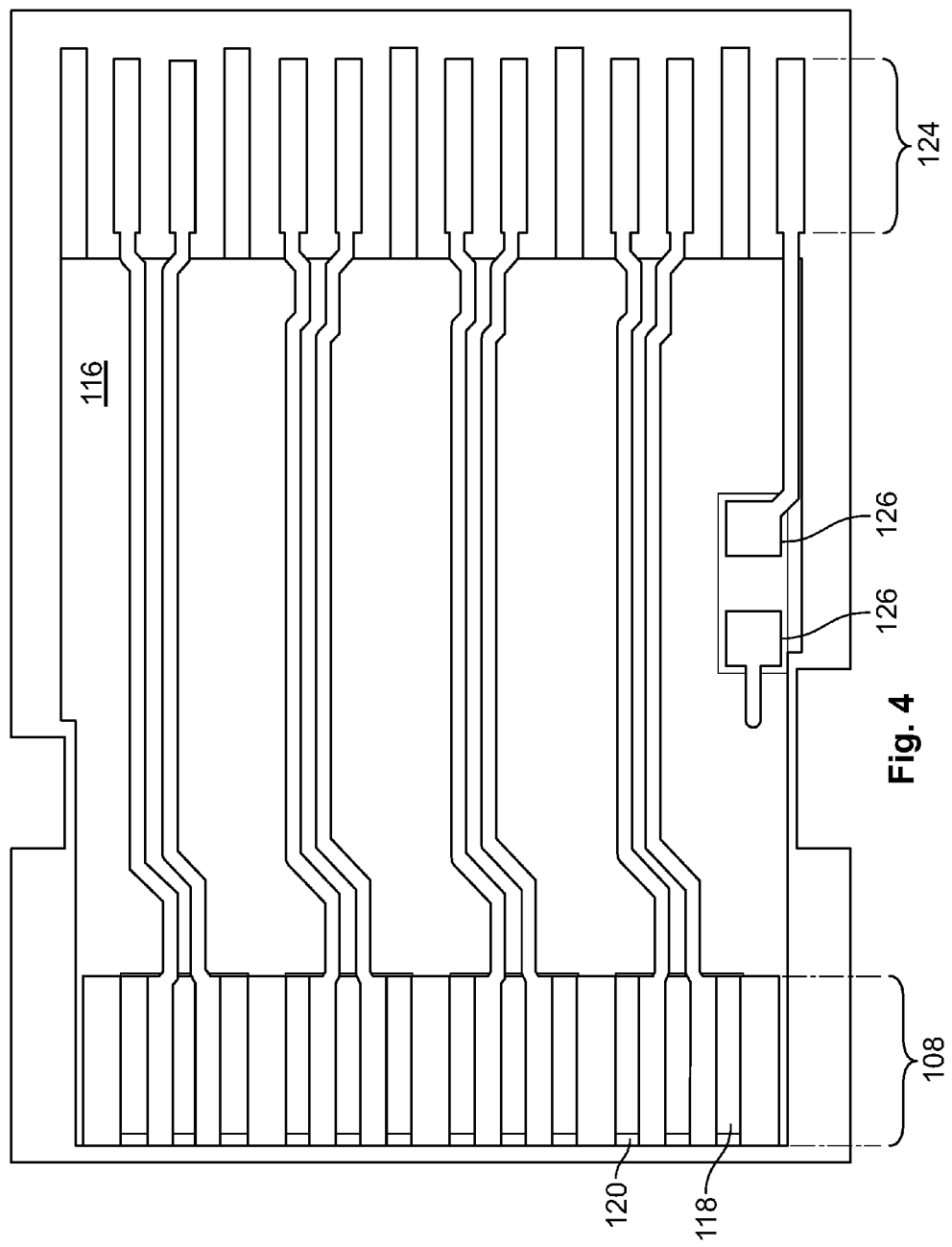
FIG. 4 shows the correlation of the first trace layer and the ground plane layer with respect to each other.

FIG. 4 illustrates schematically the location of the openings 118 extending through the grounding layer 116 with respect to the traces 106. The cross-talk suppression strip 120 extends along the length of the plug body 102 perpendicular to the direction of the traces 106, and overlaps with the conductive leads of the traces for about 10% of the length of the transition interface region 108. Thus, the cross-talk suppression strip 120 allows the overall impedance effect on the cable to be minimized, and allows impedance matching to be achieved.

The IEEE 802.3ap specification does not specify absolute cross-talk limits, but, specifies that that some channels can tolerate higher cross-talk levels, with the tolerance limit based on the ratio of insertion loss to the total cross talk (ICR). A fit of actual ICR values is defined and is set against the specification.

Figure 5:
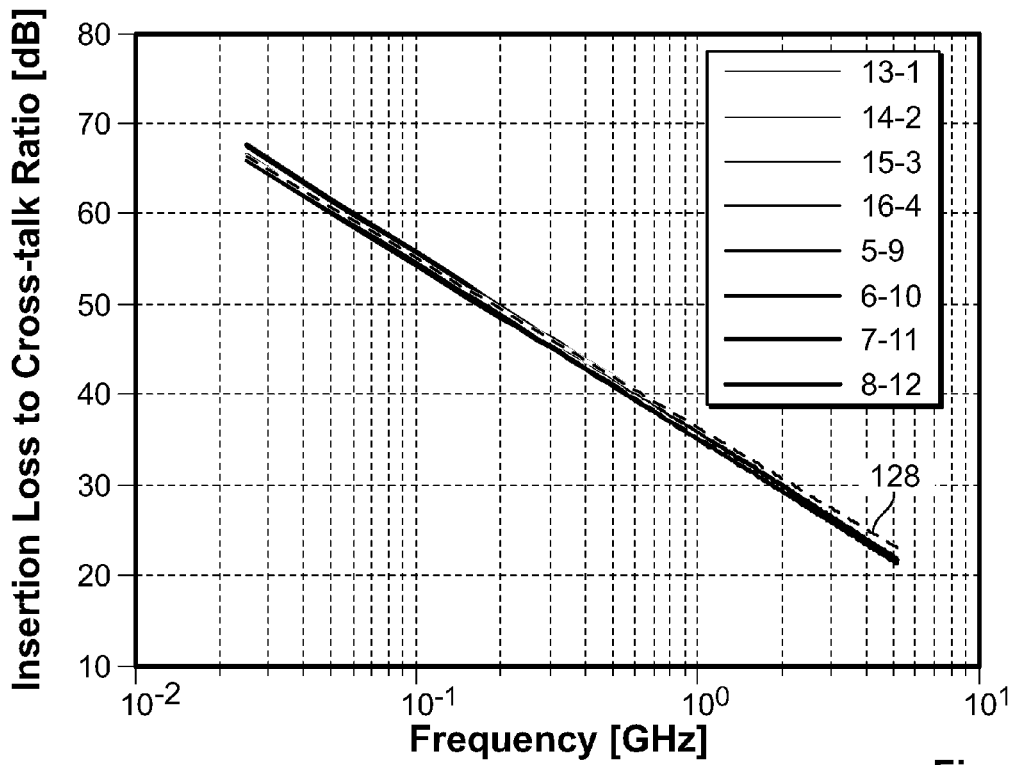
FIG. 5 shows the insertion loss to cross-talk ratio fit depending on the frequency for a conventional plug assembly compared to the requirements of the standard IEEE 802.3ap 10GBASE-KR (2008)
Figure 6:
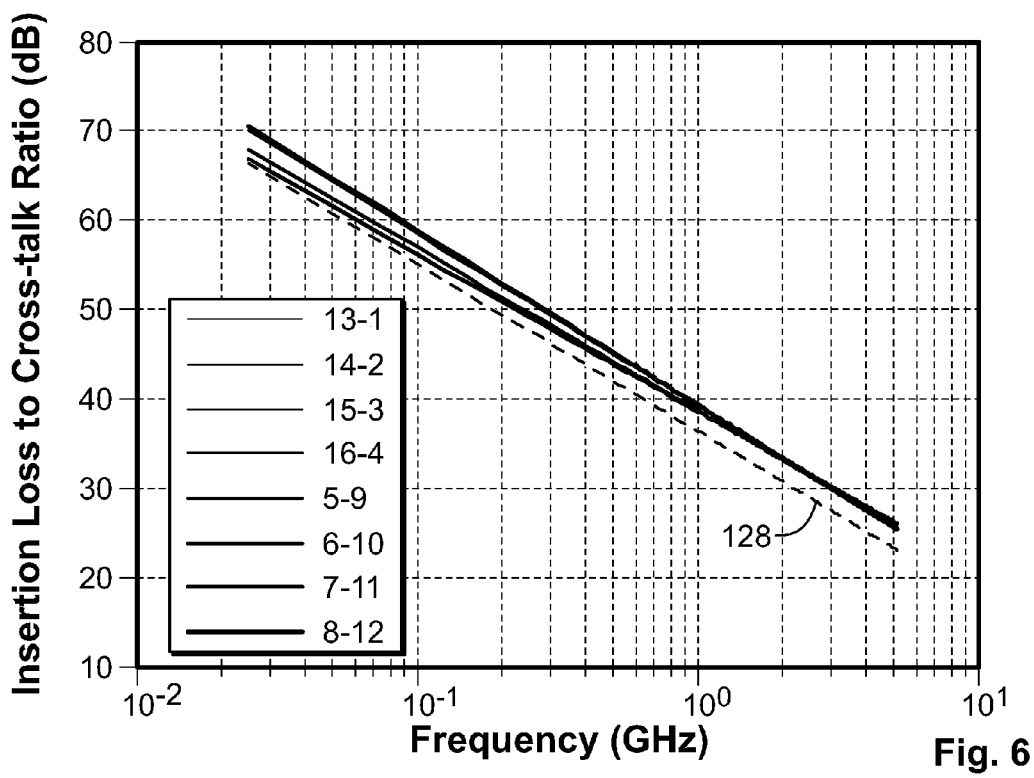
FIG. 6 shows the insertion loss to cross-talk ratio fit for the plug assembly.

FIGS. 5 and 6 illustrate an assessment of the results achieved by the exemplary embodiments described above, in view of the ICR values disclosed in IEEE 802.3ap 10GBASE-KR (2008). FIG. 5 illustrates the ICR values in the absence of the grounding layer 116 in the I/O transition interface region 108. Although the impedance matching is optimal, the cross-talk between the transmission lines and the reception lines at frequencies above 0.1 GHz are below the confidence limit for 10GBASE-KR which is shown as a broken line 128.

FIG. 6 illustrates the ICR values in the presence of the grounding layer 116 as disclosed in the above embodiments. The insertion loss to cross-talk ratio stays well above the confidence limit 128 according to 10GBASE-KR. Additionally, the ICR was further improved by about 3 dB over the total range by introducing the cross-talk suppression strip 120.

Figure 7:
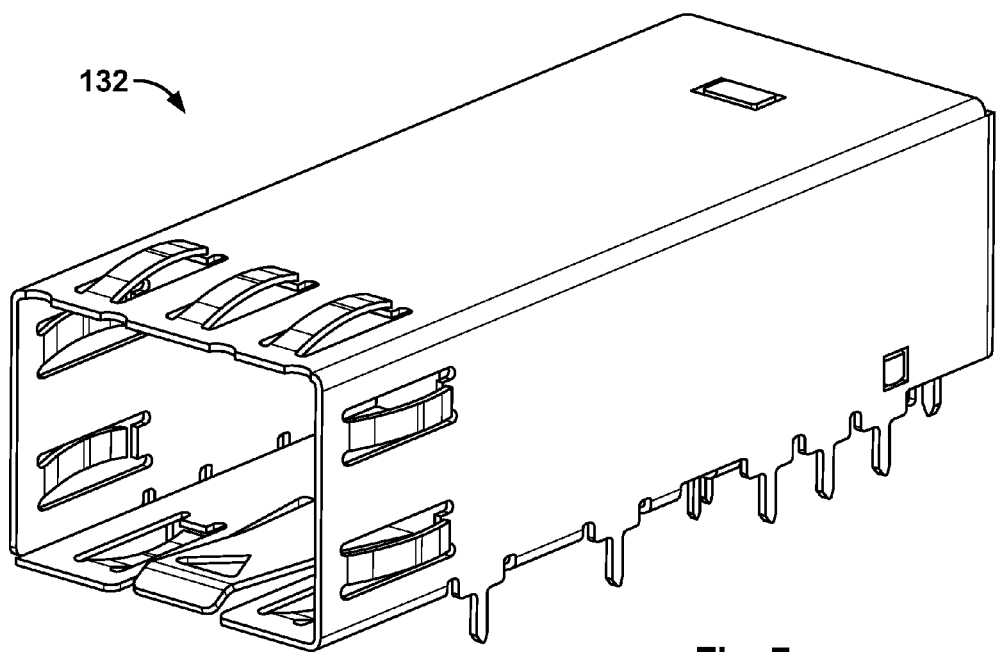
FIG. 7 shows a perspective view of a connector jack housing.
Figure 8:
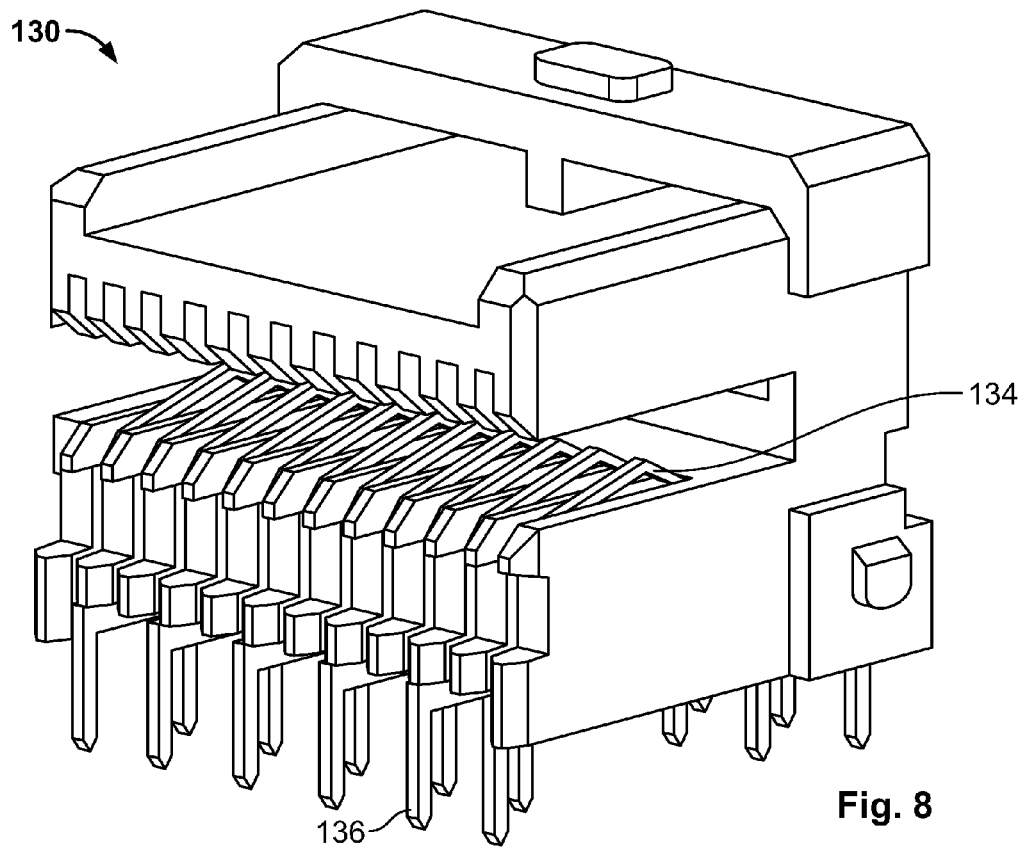
FIG. 8 shows a perspective view of an example of a connector jack contact area.

FIGS. 7 and 8 illustrate an exemplary jack connector 130 within a metal shielded housing 132, which is designed to mate with the plug assembly 100. Spring contacts 134 are provided for engaging with the contact regions of the traces 106. These spring contacts 134 are electrically connected to contact pins 136, which allow the mounting to a printed circuit board.

In an exemplary embodiment, an electrical interconnection system is provided and comprises a plurality of input/output cables 104, a plug assembly having a transition interface 108 connected the cables 104, and a jack connector. The jack connector has a plug assembly receiving space engageable with the plug assembly, and is detachably connected to contact regions provided at the plug assembly 100. The jack connector includes spring contact elements positioned in the plug assembly receiving space. for engaging with the contact regions of the plug assembly 100. Signal interferences are reduced along the cables by a pair of wires carrying differential signals representing one input or output signal, and a shielding which is connected to ground through a grounding wire 114.

The exemplary embodiments discussed above may advantageously be employed for all copper plug assembly links, especially those used in high-speed applications, such as the small form factor pluggable (SFP+), the quad small form factor pluggable (QSFP) and the high-speed input/output (HSIO) products of Tyco Electronics Corporation.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments are described herein. Variations of those embodiments may become apparent to those of ordinary skill in the art upon reading the foregoing description. The inventor(s) expect skilled artisans to employ such variations as appropriate, and the inventor(s) intend for the invention to be practiced otherwise than as specifically described herein. Accordingly, these embodiments include all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

For example, in an exemplary embodiment, the plug assembly 100 may comprise one or more cables and the transition interface 108 may include an electrically insulating housing. Furthermore, an overmolded material may be provided for mechanically securing the cables 104 to the transition interface 108.

What is claimed is:

1. A high speed input/output plug assembly comprising:
   a plug body;
   a plurality of pairs of conductive traces disposed on a surface of the plug body and connectable to an input/output cable;
   an electrically conductive grounding layer within the plug body and electrically insulated from the conductive traces and having a plurality of openings extending through the grounding layer, with each opening being positioned below each pair of conductive traces, with each opening being separated from adjacent openings by grounding strips of the grounding layer; and
   a plurality of grounding traces disposed on the surface of the plug body directly over the grounding strips of the grounding layer.

2. The plug assembly according to claim 1, wherein each conductive trace includes a transition interface region at a cable receiving end of the conductive trace which is connectible to an input/output cable.

3. The plug assembly according to claim 2, wherein the transition interface region is positioned over the opening extending through the grounding layer.

4. The plug assembly according to claim 3, wherein the length of the transition interface region from the cable receiving end to a mating end of the plug assembly is 10% greater in length than the length of the opening extending through the grounding layer.

5. The plug assembly according to claim 4, wherein the grounding layer includes a cross-talk suppression strip region extending along the width of the cable receiving end, perpendicular to the direction of the conductive traces.

6. The plug assembly according to claim 5, wherein the cross-talk suppression strip region overlaps with the 10% greater in length portion of the transition interface region at the cable receiving end of the conductive trace.

7. The plug assembly according to claim 1, wherein the grounding layer has a plurality of openings extending through the grounding layer.

8. The plug assembly according to claim 7, wherein each opening extending through the grounding layer is separated from each adjacent opening extending through the grounding layer by metal strips of the grounding layer.

9. The plug assembly according to claim 1, further comprising a plurality of conductive traces disposed on an opposite surface of the plug body and connectable to another input/output cable.

10. The plug assembly according to claim 9, further comprising a second electrically conductive grounding layer positioned within the plug body and electrically insulated from the conductive traces, and having an opening extending through the grounding layer.

11. The plug assembly according to claim 1, wherein the impedance of each conductive trace is matched to the impedance of the input/output cable.

12. The plug assembly according to claim 1, wherein said plug body is a multilayer printed circuit board.

13. The plug assembly according to claim 1, wherein the grounding layer is made of copper.

14. The plug assembly according to claim 1, wherein the input/output cable comprises a pair of wires.

15. The plug assembly according to claim 1, further comprising an overmolded plug housing.

16. The plug assembly according to claim 1, wherein the plurality of grounding traces on the surface of the plug body are connected to the conductive grounding layer within the plug body.

17. An electrical interconnection system comprising:
a plurality of input/output cables;
a plug assembly including:
  a plug body,
  a plurality of pairs of conductive traces disposed on opposite faces of the plug body and connectable to the plurality of input/output cables, and
  a pair of electrically conductive grounding layers positioned within the plug body and electrically insulated from the conductive traces, and each having a plurality of openings extending through the grounding layers and being positioned directly below each pair of conductive traces, with each opening being separated from adjacent openings by grounding strips of the grounding layer, and
  a plurality of grounding traces disposed on at least one of the opposite faces of the plug body, each grounding trace being positioned directly over one of the grounding strips of the grounding layer; and
a jack connector having a plug assembly receiving space engageable with the plug assembly.

18. The electrical interconnection system according to claim 17, wherein the jack connector comprises spring contact elements positioned in a plug assembly receiving space and engageable with the conductive traces.

19. The electrical interconnection system according to claim 17, wherein each input/output cable comprises a pair of wires for carrying different signals and a shielding connectable to a ground.

20. The electrical interconnection system according to claim 17, wherein the plurality of grounding traces on the surface of the plug body are connected to the conductive grounding layer within the plug body.

21. A plug assembly comprising:
a plug body;
a plurality of pairs of conductive traces disposed on opposite faces of the plug body, the pairs of conductive traces on one face of the plug body being input leads, and the pairs of conductive traces on the opposite face of the plug body being output leads;
an electrically conductive grounding layer positioned within the plug body;
a plurality of adjacent openings disposed in the grounding layer and being positioned directly below each pair of conductive traces, each opening being separated from adjacent openings by grounding strips of the grounding layer;
a plurality of grounding conductive traces disposed on one of the faces of the plug body, each grounding conductive trace being positioned directly over one of the grounding strips of the grounding layer.

22. The plug assembly according to claim 21, wherein the plurality of grounding conductive traces are connected together as a common ground.

23. The plug assembly according to claim 22, wherein the plurality of grounding conductive traces are connected to the conductive grounding layer positioned within the plug body.

* * * * *